US012607695B2

(12) United States Patent　　　　(10) Patent No.: US 12,607,695 B2
Arberet et al.　　　　　　　　　　(45) Date of Patent: Apr. 21, 2026

(54) TIME COMPRESSED DYNAMIC MR DEEP LEARNING RECONSTRUCTION

(71) Applicant: Siemens Healthineers AG, Forchheim (DE)

(72) Inventors: Simon Arberet, Princeton, NJ (US); Mahmoud Mostapha, Princeton, NJ (US); Marcel Dominik Nickel, Herzogenaurach (DE); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 355 days.

(21) Appl. No.: 18/343,777

(22) Filed: Jun. 29, 2023

(65) Prior Publication Data

US 2025/0004085 A1　　Jan. 2, 2025

(51) Int. Cl.
*G01R 33/561*　　　(2006.01)
*G06T 7/00*　　　　(2017.01)

(52) U.S. Cl.
CPC ............ *G01R 33/5611* (2013.01); *G06T 7/97* (2017.01); *G06T 2207/10088* (2013.01); *G06T 2207/20084* (2013.01)

(58) Field of Classification Search
CPC ... G01R 33/5611; G01R 33/5608; G06T 7/97; G06T 2207/10088; G06T 2207/20084
See application file for complete search history.

(56) References Cited

U.S. PATENT DOCUMENTS

| 2019/0064296 A1* | 2/2019 | Otazo | ................... | G01R 33/28 |
| 2020/0289019 A1* | 9/2020 | Schlemper | ............ | G06V 10/92 |
| 2022/0375141 A1* | 11/2022 | Sandino | ............... | A61B 5/0515 |

OTHER PUBLICATIONS

De Campos, M.L., Strang, G. (2009). QR Decomposition An Annotated Bibliography. In: QRD-RLS Adaptive Filtering. Springer, Boston, MA. https://doi.org/10.1007/978-0-387-09734-3_1 (Year: 2009).*
M. L. P. Rani, G. S. Rao and B. P. Rao, "Performance Analysis of Compression Techniques Using LM Algorithm and SVD for Medical Images," 2019 6th International Conference on Signal Processing and Integrated Networks (SPIN), Noida, India, 2019, pp. 654-659, doi: 10.1109/SPIN.2019.8711601. (Year: 2019).*
Arberet, Simon, et al. "A parallel spatial and Bloch manifold regularized iterative reconstruction method for MR Fingerprinting." Magnetic Resonance Imaging 82 (2021): 74-90.
C. C. Cline, X. Chen, B. Mailhe, Q. Wang, J. Pfeuffer, M. Nittka, M. A. Griswold, P. Speier, M. S. Nadar, AIR-MRF: Accelerated iterative reconstruction for magnetic resonance fingerprinting, Magnetic resonance imaging 41 (2017) 29-40.
D. F. McGivney, E. Pierre, D. Ma, Y. Jiang, H. Saybasili, V. Gulani, M. A. Griswold, SVD compression for magnetic resonance fingerprinting in the time domain, IEEE transactions on medical imaging 33 (12) (2014) 2311-2322.

(Continued)

*Primary Examiner* — Oneal R Mistry
*Assistant Examiner* — Rachel L Roberts

(57) ABSTRACT
Systems and methods for reconstruction for a medical imaging system. Non-Cartesian k-space data is acquired using a dynamic MR sequence. A time compression network compresses the non-Cartesian data. The compressed data is used for reconstruction of an image. The time compression network is configured to reduce the (time and memory) complexity of the reconstruction process.

20 Claims, 4 Drawing Sheets

Unrolled Iterative Reconstruction
Algorithm 303

Time Compression
Network 301 kspace:
compressed
coils x
time x
num_lines x
readout extrapolation　gradient update　regularization CSMs multichannel
image data:
compressed
time x h x w Time
Decompression
Network 305

Imaging model:

$A = F C^H S$ $A^H = S^H C F^H$

F: NuFFT
C: temporal compression matrix
S: coil sensitivity maps (CSMs)
$\Psi_{CNN}$: Regularization network, e.g. DIDN network with multiple (the different time components and the real and imaginary parts in separate channels) inputs and outputs.
D: density compensation function (DCF) (optional)

(56) References Cited

OTHER PUBLICATIONS

Feng, Li, et al. "XD-GRASP: golden-angle radial MRI with reconstruction of extra motion-state dimensions using compressed sensing." Magnetic resonance in medicine 75.2 (2016): 775-788.
Jafari, Ramin, et al. "GRASPNET: Fast spatiotemporal deep learning reconstruction of golden-angle radial data for free-breathing dynamic contrast-enhanced magnetic resonance imaging." NMR in Biomedicine (2022): e4861.

* cited by examiner

Imaging model:

$A = F C^H S$ $A^H = S^H C F^H$

F: NuFFT

C: temporal compression matrix

S: coil sensitivity maps (CSMs)

$\Psi_{CNN}$: Regularization network, e.g. DIDN network with multiple (the different time components and the real and imaginary parts in separate channels) inputs and outputs.

D: density compensation function (DCF) (optional)

410 Scan Patient

420 Compress K-space data

430 Reconstruct Image

440 Output Image

TIME COMPRESSED DYNAMIC MR DEEP LEARNING RECONSTRUCTION

FIELD

This disclosure relates to medical image reconstruction, such as reconstruction in magnetic resonance (MR) imaging.

BACKGROUND

Magnetic resonance imaging (MRI) is an important and useful imaging modality used in clinical practice. MRI is a non-invasive imaging technology that produces three dimensional detailed anatomical images. It is often used for disease detection, diagnosis, and treatment monitoring. Most clinical MR images are acquired using a Cartesian sampling trajectory. Using a Cartesian trajectory, MR measurements (also known as k-space lines) are collected in a sequential line-by-line manner to fill in a Cartesian grid. When a Nyquist sampling rate is satisfied for k-space acquisition, a Fast Fourier Transform (FFT) may be performed to reconstruct an MR image. The MR image may then be used by clinicians to diagnosis or analyze a patient. The image data may be further processed. While Cartesian sampling is used in a majority of applications, in recent years, radial sampling, e.g. non-Cartesian sampling, has captured substantial attention and interest for use in MRI.

Instead of collecting k-space lines in a parallel scheme as in the Cartesian trajectory, radial sampling collects k-space lines in a star shape. Each radial k-space line (referred to as a radial spoke or simply a spoke) passes through the center of k-space. Similar to Cartesian sampling, all the rotating radial spokes are also acquired line-by-line sequentially but overlapping around the center of k-space. These radial k-space measurements may then be processed to reconstruct an MR image. This sampling scheme offers flexibility to design how those radial spokes are rotated from one to the next. One of the most well-known and most often used rotation scheme is golden-angle radial sampling in which radial spokes are rotated by a so-called "golden angle" (e.g. 111.25° for two-dimensional radial sampling). This process may be referred to as GRASP (Golden-angle RAdial Sparse Parallel imaging).

Radial sampling offers several advantages for MRI applications, including improved robustness to motion compared to standard Cartesian sampling, incoherent under sampling behavior that can be synergistically combined with sparse MRI reconstruction, and continuous data acquisition with flexible data sorting among other benefits. In addition, radial sampling also offers self-navigation that can be exploited to improve motion management.

While non-Cartesian trajectories have many advantages, they are considerably more difficult to use for reconstruction as the non-Cartesian data points do not fall on a grid in k-space. In recent years deep learning (DL) reconstruction has been able to push the acceleration and reconstruction quality of MRI reconstruction even further in Cartesian reconstruction sequences such as e.g. TSE, HASTE, DWI, etc. However sequences with non-Cartesian sampling and multi-echo images such as GRASP are more challenging because the NuFFT (non-uniform fast Fourier transformation) that must be used for non-Cartesian sampling requires significantly more memory and computation than the FFT used in Cartesian sampling. In addition, multi-echo images like GRASP include an additional time dimension, which increases the challenge even more.

Certain deep learning methods have been proposed to reconstruct dynamic sampling sequences such as GRASP-NET. However, in order to reduce the computation and memory requirements, these methods process the data entirely in the image domain, i.e. with no data-consistency step. This approach reduces the computational and memory footprint of the reconstruction network, but at the expense of removing completely the data-consistency step which have been proven very valuable for the quality of the reconstruction.

SUMMARY

By way of introduction, the preferred embodiments described below include methods, systems, instructions, and computer readable media for reconstruction in medical imaging. The embodiments address the problem of DL reconstruction of dynamic non-Cartesian MRI sequences with an unrolled architecture. Embodiments include a time compression network that may be configured to manage the (time and memory) complexity of the NuFFT involved in the data-consistency step. Embodiments may also help reduce the complexity of a regularization network as the number of time components is reduced.

In a first aspect, a method of reconstruction for a medical imaging system is provided. The method includes scanning a patient by the medical imaging system, the scanning acquiring k-space scan data using a dynamic MR sequence that includes at least a time component; compressing the k-space scan data using a time compression network configured to input kspace data and generate a time compression matrix of the k-space scan data as output; reconstructing an image from the time compression matrix using an unrolled iterative reconstruction that includes at least a data-consistency step; and outputting the image.

In an embodiment, the dynamic MR sequence comprises a GRASP (Golden-angle RAdial Sparse Parallel imaging) sequence.

In an embodiment, the method further includes applying an orthogonalization procedure at an end of the time compression network. The orthogonalization procedure comprises a Gram-Schmidt orthonormalization procedure, a Cayley transformation, or a Householder transformation.

In an embodiment, the method further includes applying a decompression matrix at an end of the unrolled iterative reconstruction.

In an embodiment, the time compression network is first trained offline using supervised learning and ground truth images to generate target compression matrices; wherein the unrolled iterative reconstruction is then trained end to end with the trained time compression network. An input of the time compression network is the k-space scan data comprising a three-dimensional matrix of size: readout size×number of coils×number of time points, or as a two-dimensional matrix of size: number of coils×number of time points. An output of the time compression network is a matrix of size: number of compressed time components×number of time points, wherein the number of compressed time components is predefined by an operator. The number of compressed time components may be between five and ten and wherein the number of time points is greater than one hundred.

In an embodiment, the time compression network comprises multiple fully connected layers with nonlinear activation functions of transformer encoder layers. The time compression network may be trained with sequence of variable time points.

In a second aspect, a system for time compressed dynamic magnetic resonance deep learning reconstruction is provided. The system includes a medical imaging system configured to acquire k-space scan data using a non-Cartesian dynamic sequence; a time compression network configured to compress the k-space scan data; and a reconstruction network configured to reconstruct an image from the compressed k-space scan data.

In an embodiment the system further includes a display configured to display the image.

In a third aspect, a non-transitory computer readable storage medium comprising a set of computer-readable instructions stored thereon is provided. When executed by at least one processor the instructions cause the processor to: acquire non-Cartesian k-space scan data that includes at least a time component; compress the non-Cartesian k-space scan data using a time compression network configured to input non-Cartesian kspace data and generate a time compression matrix of the k-space scan data as output; reconstruct an image from the time compression matrix using an unrolled iterative reconstruction that includes at least a data-consistency step; and output the image.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

Embodiments provide systems and methods of reconstruction for a medical imaging system. A patient is scanned by the medical imaging system using a dynamic non-Cartesian MRI sequence. A machine trained network compresses the acquired k-space scan data to generate a time compression matrix of the kspace scan data. An image is reconstructed from the time compression matrix using an unrolled iterative reconstruction that includes at least a data-consistency step. The image is output for further processing or analysis.

Figures 1A, 1B:
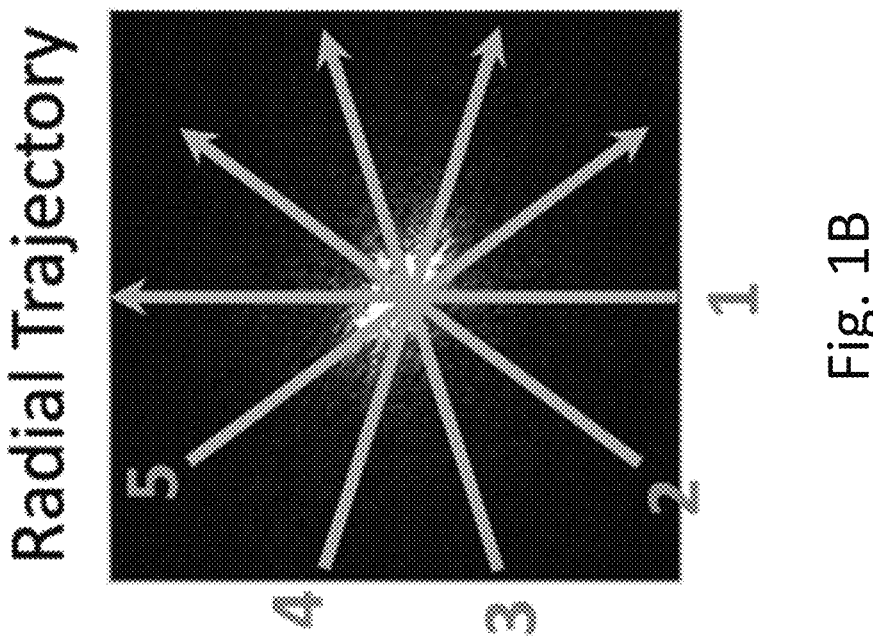
FIGS. 1A and 1B depicts examples of Cartesian and Non-Cartesian MRI sequences.

Most clinical MR imaging is performed by acquiring k-space along a Cartesian, or rectilinear, trajectory. FIG. 1 depicts an example of k-space data acquired using Cartesian and non-Cartesian sampling. For Cartesian sampling, data is sampled line-by-line on a rectangular grid as shown on the left in FIG. 1. A benefit of this sampling trajectory is that the data is uniformly sampled, and images may be easily and quickly reconstructed using a fast Fourier transform (FFT). However, k-space may also be sampled in a non-Cartesian manner for example as shown on the right in FIG. 1 where radial sampling acquires k-space lines in a star shape. Different sampling trajectories will have different properties and implications for the reconstructed image. However, most if not all non-Cartesian reconstructions performed use a non-uniform fast Fourier transform (NuFFT).

The use of non-Cartesian trajectories provides more efficient coverage of k-space, that may be leveraged to reduce scan times. These trajectories may be under sampled to achieve even faster scan times, but the resulting images may contain aliasing artifacts. Just as Cartesian parallel imaging can be employed to reconstruct images from under sampled Cartesian data, non-Cartesian parallel imaging methods may mitigate aliasing artifacts by using additional spatial encoding information in the form of the non-homogeneous sensitivities of multi-coil phased arrays.

Sampling along a non-Cartesian trajectory may have many benefits based on the unique properties of these trajectories. One of the most important properties of non-Cartesian trajectories is their potential for efficient use of MR gradient hardware and therefore rapid coverage of k-space. Additionally, many non-Cartesian trajectories contain fewer coherent artifacts from under sampling are less affected by motion, allow image contrast to be updated throughout data acquisition, and/or enable motion correction, self-navigation, ultra-short TE acquisitions, spectrally selective imaging, and chemical shift imaging. The GRASP (Golden-angle RAdial Sparse Parallel imaging) sequence is one example of a magnetic resonance imaging (MRI) sequence that combines the motion robustness of radial sampling with the acceleration capability of compressed sensing.

In standard Cartesian sampling, k-space data are sampled with an equal space along each spatial dimension, which allows for image reconstruction with a simple FFT when the Nyquist sampling rate is satisfied. Radial sampling, in contrast, leads to unequally spaced k-space data, which prevents direct FFT reconstruction. Reconstructing radial k-space data typically involves a process called gridding before the FFT, in which radial data are interpolated onto a Cartesian grid. The interpolation can be performed with a predefined kernel, with which each radial sample is smeared to neighbor Cartesian locations based on their distance and corresponding weight defined in the kernel. This entire reconstruction process is also referred to as non-uniform since it aims to reconstruct an image from unequally spaced (thus nonuniform) k-space data. The need for gridding in radial image reconstruction inevitably prolongs overall reconstruction time, particularly in iterative reconstruction.

In other multi-echo MRI sequences such as Magnetic Resonance Fingerprinting (MRF) or RadTSE, where the magnetization response of the sequence is known in advance and can thus be computed offline for every tissue parameter and stored in a dictionary, a very efficient way to compress the time dimension is to compute a singular value decomposition (SVD) on that fingerprints dictionary and use the first singular vectors as an orthonormal compression matrix. This technique has been used very efficiently for MRF and RadTSE.

In the case of dynamic non-Cartesian sequences such as GRASP, the magnetization response is not known in advance so a fingerprints dictionary cannot be generated such as in MRF. However, in certain dynamic sequences (such as XP-GRASP), time points are clustered based on motion states, in particular in respiratory and cardiac states, where the states are estimated with a heuristic way by looking at the evolution of the kspace center coefficient (DC component) across the time dimension. This clustering is a particular case of time compression. So, the available kspace data, in particular the kspace center, contains useful information that can be exploited by a neural network to compress the time dimension.

Embodiments described herein compress the time domain of the k-space data by a linear compression matrix in order to reduce the time dimensionality to only a few time points (for example around five) instead of few tens or hundreds of time points. The compression matrix may be generated using a neural network that takes the kspace data as input and generates a time compression matrix as output. In order to impose the constraint of orthogonality or orthonormality to the compression matrix generated by our neural network, an orthogonalization procedure, e.g. such as a Gram-Schmidt orthonormalization procedure or any other orthogonalization procedure such as Caley or Householder, at the end of the time-compression network. The resulting orthonormal matrix compression may also then be used in the forward and backward imaging model, the decompression matrix being simply the transpose conjugate of the compression matrix. The decompression matrix may be used at the end of the unrolled network in order to decompress the multichannel image in the individual time points. By using a temporal compression matrix, the computation and memory footprints of the reconstruction are drastically reduced and as a result data-consistency steps may be used in the network architecture for reconstruction. The time compression also includes a time regularization effect that naturally reduces the noise. The time compression may be interpreted as a low-rank regularization that is a feature that is traditionally used in iterative reconstruction, but often implemented via expensive SVD operations. As, after time compression, every compressed time component contains measurement from all the other time points (with some weighting), the under sampling of each time component is strongly reduced and thus fewer streaking artefacts are expected. Embodiments reduce a complexity of a regularization network as the number of time components is reduced to a only few components. In addition, the number of these components is fixed and they may be stacked in the channel dimension of the network. If the number of components is variable, it would not be possible, and instead a different architecture should be used to handle the variable size time dimension, for example a 3D CNN architecture.

Figure 2:
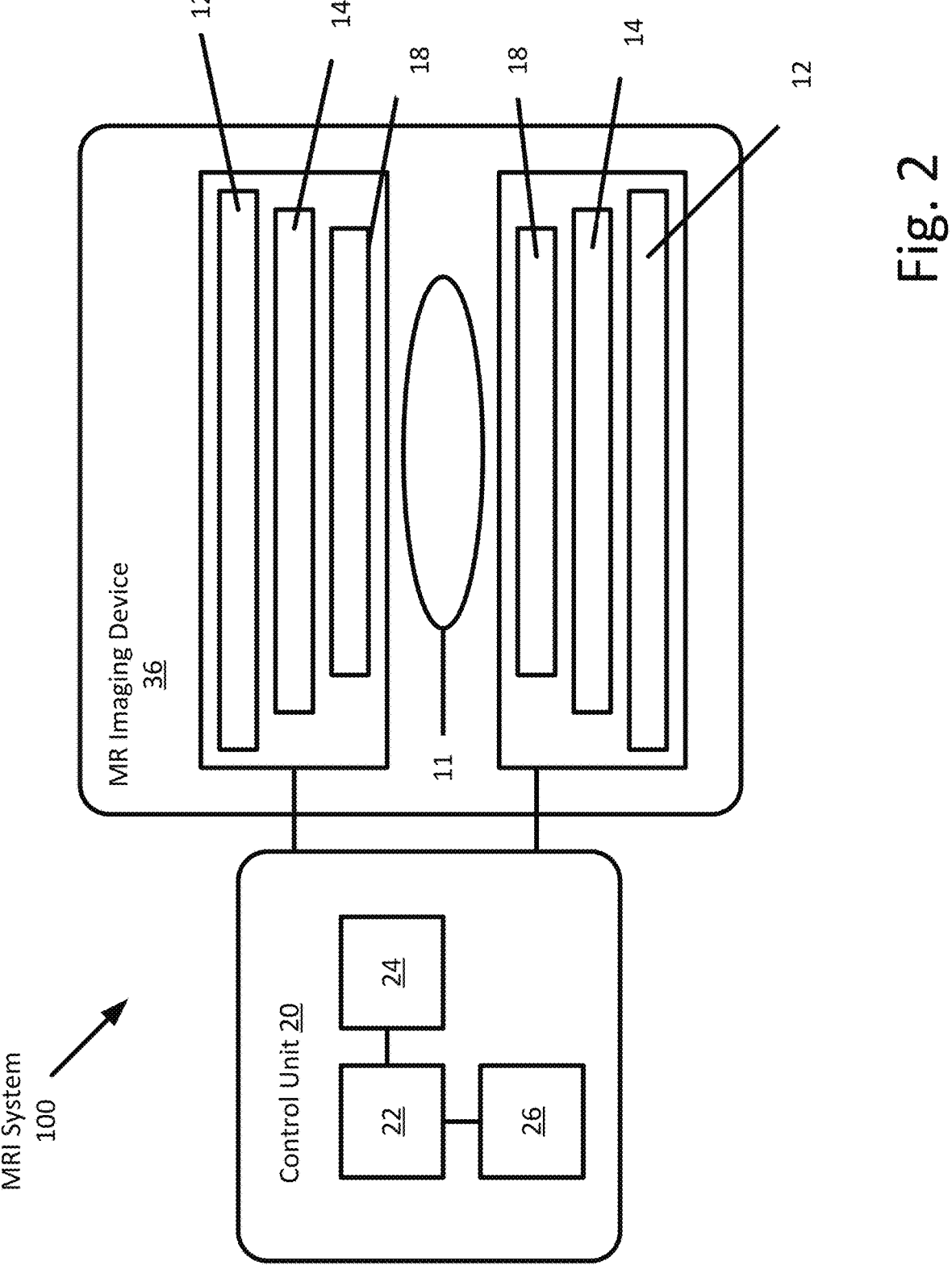
FIG. 2 depicts an example system for time compressed dynamic MR deep learning reconstruction according to an embodiment.

FIG. 2 depicts an example system for acquiring and reconstructing non-Cartesian MRI data. FIG. 2 depicts an MR imaging device 36 that is configured to acquire k-space scan data using a dynamic MR sequence such as GRASP. FIG. 2 further includes a control unit 20 that is configured to compress the k-space scan data into a time compression matrix. The control unit 20 reconstructs an MR image from the time compression matrix using an unrolled iterative reconstruction that includes at least a data-consistency step. The MR image may be output for display or further processing.

The MR system 100 includes an MR scanner 36 or system, a computer based on data obtained by MR scanning, a server, or another processor 22. The MR imaging device 36 is only exemplary, and a variety of MR scanning systems can be used to collect the MR data. The MR imaging device 36 (also referred to as a MR scanner or image scanner) is configured to scan a patient 11. The scan provides scan data in a scan domain. The MR imaging device 36 scans a patient 11 to provide k-space measurements (measurements in the frequency domain).

The MR system 100 further includes a control unit 20 configured to process the MR signals and generate images of the object or patient 11 for display to an operator. The control unit 20 includes a processor 22 that is configured to execute instructions, or the method described herein. The control unit 20 may store the MR signals and images in a memory 24 for later processing or viewing. The control unit 20 may include a display 26 for presentation of images to an operator.

In the MR system 100, magnetic coils 12 create a static base or main magnetic field B0 in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 may include a RF (radio frequency) module that provides RF pulse signals to RF coil 18. The RF coil 18 produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g. signals from the excited protons within the body as the protons return to an equilibrium position established by the static and gradient magnetic fields. The MR signals are detected and processed by a detector within RF module and the control unit 20 to provide an MR dataset to a processor 22 for processing into an image. In some embodiments, the processor 22 is located in the control unit 20, in other embodiments, the processor 22 is located remotely. A two or three-dimensional k-space storage array of individual data elements in a memory 24 of the control unit 20 stores corresponding individual frequency components including an MR dataset. The k-space array of individual data elements includes a designated center, and individual data elements individually include a radius to the designated center.

A magnetic field generator (including coils 12, 14 and 18) generates a magnetic field for use in acquiring multiple individual frequency components corresponding to individual data elements in the storage array. The individual frequency components are successively acquired using a Cartesian or other spatial acquisition strategy as the multiple individual frequency components are sequentially acquired during acquisition of an MR dataset. A storage processor in the control unit 20 stores individual frequency components acquired using the magnetic field in corresponding individual data elements in the array. The row and/or column of corresponding individual data elements alternately increases and decreases as multiple sequential individual frequency components are acquired. The magnetic field generator acquires individual frequency components in an order corresponding to a sequence of substantially adjacent individual data elements in the array, and magnetic field gradient change between successively acquired frequency components is substantially minimized.

The control unit 20 may use information stored in an internal database to process the detected MR signals in a coordinated manner to generate high quality images of a selected slice(s) of the body (e.g., using the image data processor) and adjusts other parameters of the system 100. The stored information includes a predetermined pulse sequence of an imaging protocol and a magnetic field gradient and strength data as well as data indicating timing, orientation, and spatial volume of gradient magnetic fields to be applied in imaging.

The MR imaging device 36 is configured by the imaging protocol to scan a region of a patient 11. For example, in MR, such protocols for scanning a patient 11 for a given examination or appointment include diffusion-weighted imaging (acquisition of multiple b-values, averages, and/or diffusion directions), turbo-spin-echo imaging (acquisition of multiple averages), or contrast. In one embodiment, the protocol is for compressed sensing.

In an embodiment, a DCE-MRI method known as golden-angle radial sparse parallel (GRASP) is used. This embodiment may use a combination of compressed sensing and parallel imaging to acquire simultaneous high spatial and temporal resolution. The GRASP technique exploits joint multicoil sparsity techniques to allow continuous acquisition of dynamic information before, during, and after contrast agent injection. During image reconstruction, the k-space data are sorted into sequential timeframes, compressed using the time compression network then reconstructed using under sampled data in a compressed sensing iterative method. In an embodiment, the MR data may represent a volume. Three-dimensional datasets are obtained. As k-space data, information content may be provided that is responsive to a three-dimensional distribution of locations, but the data itself does not directly represent the locations prior to transform. In alternative embodiments, two-dimensional datasets representing or responsive to tissue in planes are obtained. In other embodiments, sequences of MR data responsive to the same tissue over time are acquired. In an example, two-dimensional GRASP may be used for fast real time dynamic MR for two-dimensional application. For three-dimensional applications, volumetric acquisitions can be performed using, for example stack-of-stars (e.g., Cartesian sampling along kz and radial sampling along ky–kx) and/or three-dimensional golden-angle radial trajectories.

Embodiments use compressed sensing to provide a rapid imaging approach, exploiting image sparsity and compressibility. Instead of acquiring a fully sampled image and compressing it afterwards (e.g., standard compression), compressed sensing reconstructs the sparse representation from under sampled data, for example, without loss of important information. Embodiments may use compressed sensing with other acceleration methods in MRI, such as parallel imaging, to further increase the imaging speed. In parallel imaging multiple local coils are used to receive the data, providing additional information for reconstruction. In an embodiment, the protocol is for parallel imaging with compressed sensing.

The system 100 may include an operator interface that is coupled to the control unit 20. The operator interface may include an input interface and an output interface. The input may be an interface, such as interfacing with a computer network, memory, database, medical image storage, or other source of input data. The input may be a user input device, such as a mouse, trackpad, keyboard, roller ball, touch pad, touch screen, or another apparatus for receiving user input. The output is a display device but may be an interface. The final and/or intermediate MR images reconstructed from the scan are displayed. For example, an image of a region of the patient 11 is displayed. A generated image of the reconstructed representation for a given patient 11 is presented on a display of the operator interface. The display 26 is a CRT, LCD, plasma, projector, printer, or other display device. The display is configured by loading an image to a display plane or buffer. The display is configured to display the reconstructed MR image of the region of the patient 11. The processor 22 of the operator interface forms a graphical user interface (GUI) enabling user interaction with MR imaging device 36 and enables user modification in substantially real time. The control unit 20 processes the magnetic resonance signals to provide image representative data for display on the display 26, for example.

The processor 22 is a processor 22 that reconstructs a representation of the patient 11 from the k-space data. The processor 22 inputs the k-space data, compresses the k-space data using a trained time compression network and then reconstructs an image using an iterative reconstruction process. A decompression network may also be provided at the end of the reconstruction process. Different reconstruction processes may be used depending on the type of sequence used. The processor 22 is a general processor, digital signal processor, three-dimensional data processor, graphics processing unit, application specific integrated circuit, field programmable gate array, artificial intelligence processor, digital circuit, analog circuit, combinations thereof, or another now known or later developed device for reconstruction. The processor 22 is a single device, a plurality of devices, or a network. For more than one device, parallel or sequential division of processing may be used. Different devices making up the processor 22 may perform different functions, such as reconstructing by one device and volume rendering by another device. In one embodiment, the processor 22 is a control processor or other processor of the MR system 100. Other processors of the MR system 100 or external to the MR system 100 may be used. The processor 22 is configured by software, firmware, and/or hardware to reconstruct. The instructions for implementing the processes, methods, and/or techniques discussed herein are provided on non-transitory computer-readable storage media or memories, such as a cache, buffer, RAM, removable media, hard drive, or other computer readable storage media. The instructions are executable by the processor or another processor. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the instructions set, storage media, processor or processing strategy and may be performed by software, hardware, integrated circuits, firmware, micro code, and the like, operating alone or in combination. In one embodiment, the instructions are stored on a removable media device for reading by local or remote systems. In other embodiments, the instructions are stored in a remote location for transfer through a computer network. In yet other embodiments, the instructions are stored within a given computer, CPU, GPU, or system. Because some of the constituent system components and method steps depicted in the accompanying figures may be implemented in software, the actual connections between the system components (or the process steps) may differ depending upon the manner in which the present embodiments are programmed.

The processor 22 is configured to reconstruct a representation of a scan region, such as a region of the patient 11. The processor 22 is configured to reconstruct a representation in an object domain. The representation or object in the object domain is reconstructed from the scan data in the scan domain. The scan data is a set or frame of k-space data from a scan of the patient 11. The object domain is an image space and corresponds to the spatial distribution of the patient 11. A planar or volume representation or object is reconstructed as an image representing the patient 11. For example, pixels values representing tissue in an area or voxel values representing tissue distributed in a volume are generated.

The control unit 20 performs reconstruction. The reconstruction is performed, at least in part, using a machine-learned model or algorithm. The input k-space data, for example, is input into a machine-learned network that is configured to compress the k-space data into a time compression matrix. The time compression matrix is input into a machine-learned model that is configured to reconstruct the representation (image). The machine-learned model is formed from one or more networks and/or other machine-learned arrangements (e.g., support vector machine). For an example used herein, the machine-learned model includes at least one or more deep-learned neural networks such as the time compression network/time decompression network and/or included in an unrolled iterative reconstruction algorithm. A machine-learned model is used for at least part of the reconstruction, such as for regularization. In regularization, the image or object domain data is input, and image or object domain data with less artifact is output. The remaining portions or stages of the reconstruction (e.g., non-uniform Fast Fourier transform and gradients in iterative optimization) are performed using reconstruction algorithms and/or other machine-learned networks. In other embodiments, a machine-learned model is used for all the reconstruction operations (one model to input k-space data and output regularized image data) or other reconstruction operations (e.g., used for transform, gradient operation, and/or regularization). The reconstruction is of an object or image domain from projections or measurements in another domain, and the machine-learned model is used for at least part of the reconstruction.

In embodiments, an unrolled iterative reconstruction is provided that alternates gradient updates and regularization where a machine-learned network is provided for regularization through iteration sequences. Each given iteration either in an unrolled network or through a repetition of the reconstruction operations includes a gradient update and regularization. The gradient update compares the current image object with the scan data (e.g., k-space measurements). This comparison uses a system transform to relate the measurements to the image object. A gradient or comparison relating the image object to the measurements may be used.

Figure 3:
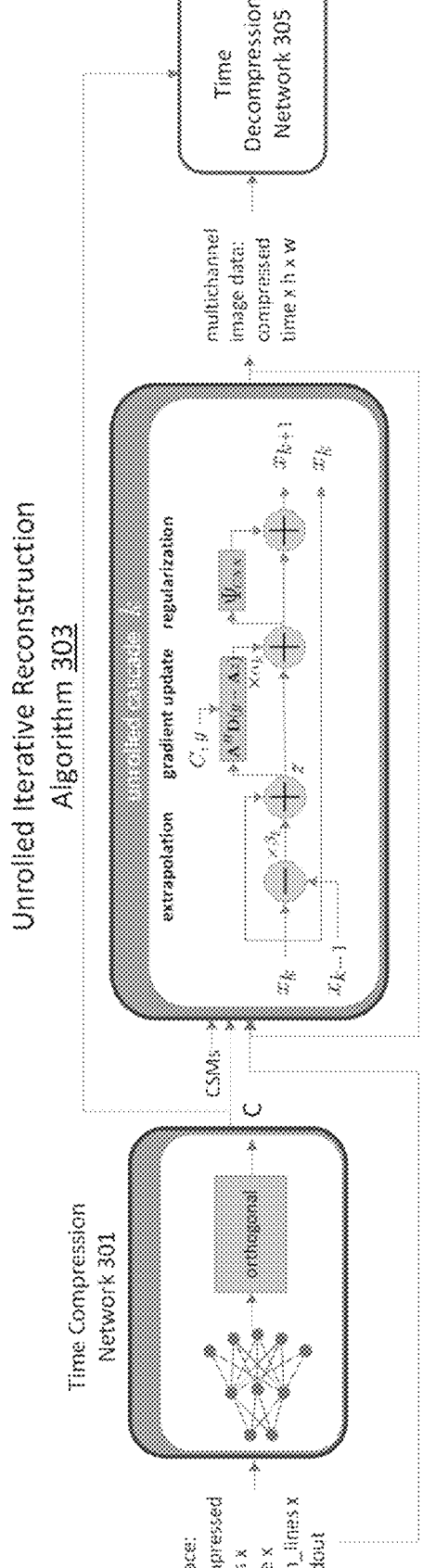
FIG. 3 depicts an example of the reconstruction process for time compressed dynamic MR deep learning reconstruction according to an embodiment.

FIG. 3 depicts an example of an unrolled iterative reconstruction algorithm 303 including a time compression network 301 and time decompression 305. The reconstruction process includes a time compression network 301 that inputs the non-Cartesian k-space data and outputs a compressed matrix. The input k-space data may be shaped as a three-dimensional matrix of size: readout size×number of coils×number of time points, or as a two-dimensional matrix of size: number of coils×number of time points in the case where only the center kspace data is used. The output of the time compression network 301 may be a matrix of size: number of compressed time components×number of time points, where the number of compressed time components may be predefined or defined by the user and, for example, may be five to ten, while the number of time points may be a hundred or more. The number of the time components may be fixed and thus may be stackable in the channel dimension of the network. The reconstruction process may also include a decompression network 305 at the end of the process where the time points may be decompressed by applying the decompression matrix to the compressed time image (i.e. each pixel of the image is a vector in the compressed time dimension which can be multiplied by the decompression matrix). If an operator does not want to retrieve all the time points but rather prefers a different clustering of time points, e.g. frames of fifty consecutive time points, then the clustering may be expressed by a matrix (e.g. a block diagonal matrix in the case of the frames example) that may be multiplied to the decompression matrix prior to actually computing the image decompression. In that case the resulting image decompression may be directly in the desired time clustering format.

The time compression network 301 may be a neural network. Any type of configuration may be used. Different types of models or networks may be trained and used as the time compression network 301 (and other networks described herein). In an embodiment, the time compression network 301 and/or other networks/models may include a neural network that is defined as a plurality of sequential feature units or layers. Sequential is used to indicate the general flow of output feature values from one layer to input to a next layer. Sequential is used to indicate the general flow of output feature values from one layer to input to a next layer. The information from the next layer is fed to a next layer, and so on until the final output. The layers may only feed forward or may be bi-directional, including some feedback to a previous layer. The nodes of each layer or unit may connect with all or only a sub-set of nodes of a previous and/or subsequent layer or unit. Skip connections may be used, such as a layer outputting to the sequentially next layer as well as other layers. Rather than pre-programming the features and trying to relate the features to attributes, the deep architecture is defined to learn the features at different levels of abstraction based on the input data. The features are learned to reconstruct lower-level features (i.e., features at a more abstract or compressed level). Each node of the unit represents a feature. Different units are provided for learning different features. Various units or layers may be used, such as convolutional, pooling (e.g., max pooling), deconvolutional, fully connected, or other types of layers. Within a unit or layer, any number of nodes is provided. For example, one hundred nodes are provided. Later or subsequent units may have more, fewer, or the same number of nodes.

In an embodiment, the time compression network 301 includes multiple fully connected layers with nonlinear activation functions of transformer encoder layers. Downsampling (in the readout direction) convolution blocks (e.g. composed of convolutional layers are followed by layer normalization and rectified liner unit (ReLU) activation function and a max-pooling operation) may be used before the fully connected layers for the case of a three-dimensional matrix size input in order to compress the readout direction into a sequence of feature vectors.

Different neural network configurations and workflows may be used for the network such as a convolution neural network (CNN), deep belief nets (DBN), or other deep networks. CNN learns feed-forward mapping functions while DBN learns a generative model of data. In addition, CNN uses shared weights for all local regions while DBN is a fully connected network (e.g., including different weights for all regions of a feature map. The training of CNN is entirely discriminative through backpropagation. DBN, on the other hand, employs the layer-wise unsupervised training (e.g., pre-training) followed by the discriminative refinement with backpropagation if necessary. In an embodiment, the arrangement of the trained network is a fully convolutional network (FCN). Alternative network arrangements may be used, for example, a three-dimensional Very Deep Convolutional Networks (3D-VGGNet). VGGNet stacks many layer blocks containing narrow convolutional layers followed by max pooling layers. A three-dimensional Deep Residual Networks (three-dimensional-ResNet) architecture may be used. A Resnet uses residual blocks and skip connections to learn residual mapping. The training data for the time compression network 301 (and other networks) includes ground truth data or gold standard data. Different training data may be acquired and annotated.

In an embodiment, the time compression network 301 is trained initially on its own. The reconstruction process is then configured including training the entire reconstruction process end to end with the trained time compression network 301. In order to be able to use the time compression network 301 for a variable number of time points in the raw sequence, the time compression network 301 may be trained with sequence of variable time points. If the raw input has less time points than the network time dimension, the last remaining time points of the inputs are simply filled with zeros. These last time points which account for the difference between the number of time points of the network and the number of time points of the input measurements are then discarded at the input of the orthogonalization module of the time compression network 301.

The reconstruction process using the unrolled iterative reconstruction algorithm 303 may be formulated as a minimization problem. The goal of the optimization is to reconstruct an image set m that best matches the measured data y in the least squares sense. The network architecture of the reconstruction process utilizes data consistency, as exemplified by the gradient update step. Unrolled reconstructions include alternating between a data consistency step and a regularization step based on a neural network. The data consistency may be based on cost function of the form: $D=\|Ax-y\|^2$, where y corresponds to the acquired, undersampled data and A the signal model that relates the target image×with the data. The signal model may be based on SENSE. Sensitivity encoding (SENSE) is based on the fact that receiver sensitivity generally has an encoding effect complementary to Fourier preparation by linear field gradients. Thus, by using multiple receiver coils in parallel scan time in Fourier imaging can be considerably reduced. The problem of image reconstruction from sensitivity encoded data is formulated in a general fashion and solved for arbitrary coil configurations and k-space sampling patterns. The signal model may be written as: A=PUC, where P is the projection on the sampled data, U is the non-uniform Fourier transformation (or inverse non-uniform Fourier transformation depending on convention) and C the precalculated coil sensitivity maps. The ingredient for the unrolled deep learning reconstruction is then the gradient: $G=\nabla_x+D=A^+(Ax-y)$, that is used to guide the network to consistency with the acquired data. The regularization is performed by a neural network and is a nonlinear mapping: $x'=U(x)$.

The unrolled iterative reconstruction algorithm 303 performs fixed step sizes in the opposite direction of the gradient. The step-size may also be configured as a training parameter. In certain configurations, the gradient step may be performed 'with momentum' and be evaluated for an image that is different from the image put into the regularization network. The regularization network is non-linear and expects a certain dynamic range typically set in the preprocessing of the network.

The reconstruction and other networks, for example for regularization, may perform as conventionally implemented. Various machine-learned models may be used, such as a neural network or support vector machine. In one embodiment, the machine-learned model includes a convolutional neural network, such as an image-to-image network or U-Net.

The final number of reconstructed time-points may be decided a posteriori as the reconstruction is done in an embedded (compressed) abstract space and the data is then decompressed to the full-time resolution. An operator may decide the time resolution a posteriori, or regroup the time points in a different order, e.g. an operator may choose to regroup them by motion state or contrast state. As mentioned earlier it can be implemented efficiently by multiplying the decompression matrix of the last module with a new matrix representing the desired time representation.

The reconstruction process including the trained time compression network 301 is trained end to end and configured using training data. When implemented, the reconstruction process is configured to input the non-Cartesian k-space data from the scanner and to output a representation of the object or region from which the raw data was acquired. The computation requirements and speed of the reconstruction process may be improved over existing methods by using the time compression network 301. Additional benefits such as a higher quality image may also be provided. In certain embodiments, additional inputs to the reconstruction process may be specified such an acceleration factor and other scanning parameters. The output representation by the processor 22 may be a complex or real image. The output image represents the patient 11 (i.e., a reconstructed representation). The processor 22 may be configured to generate an MR image from the representation. Where the representation is of an area, the values of the representation may be mapped to display values (e.g., scalar values to display color values) and/or formatted for display (e.g., interpolated to a display pixel grid). Alternatively, the output representation is of display values in the display format. Where the representation is of a volume, the processor 22 performs volume or surface rendering to render a two-dimensional image from the voxels of the volume. This two-dimensional image may be mapped and/or formatted for display as an MR image. Any MR image generation may be used so that the image represents the measured MR response from the patient 11. The image represents a region of the patient 11.

Key differences of the proposed approach compared to existing approaches for dynamic MR reconstruction, especially GRASP, are the use of the time compression matrix which is estimated by the time compression network 301. The time compression matrix is used in the forward and backward imaging model of the data-consistency step of the unrolled iterative reconstruction algorithm 303. The advantages of using a temporal compression matrix are that the computation and memory footprints of the reconstruction are drastically reduced and as a result data-consistency steps can be used in the network architecture. In addition, the time compression has a time regularization effect that reduces the noise.

Figure 4:
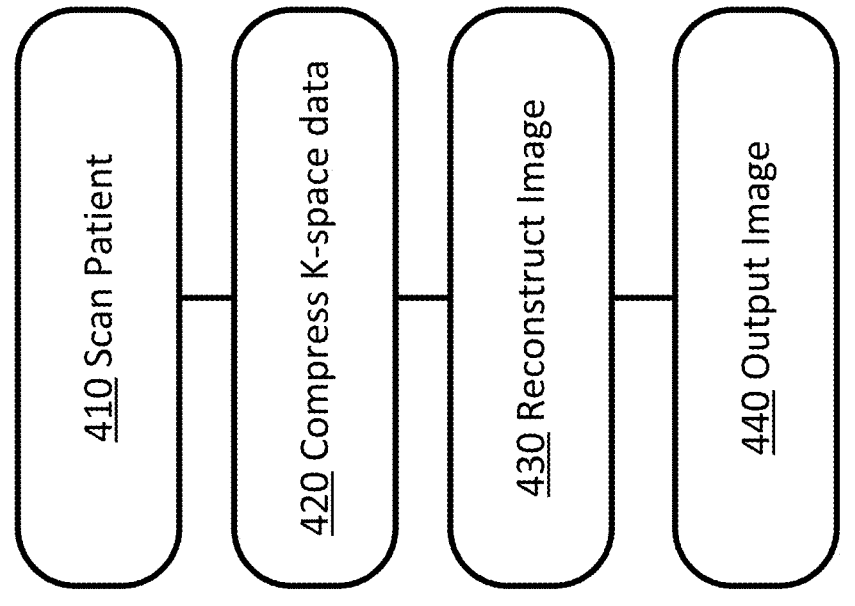
FIG. 4 depicts an example of a workflow for time compressed dynamic MR deep learning reconstruction according to an embodiment.

FIG. 4 is a flow chart diagram of one embodiment of a method for reconstruction of a medical image in a medical imaging system 100, such as reconstruction of a MR image in an MR system 100. The method is performed by the system 100 of FIG. 2 or another system and may use the unrolled reconstruction algorithm of FIG. 3 or other reconstruction algorithm. The medical scanner scans the patient 11 using a dynamic sequence including at least a time component. A representation is reconstructed from the dynamic sequence k-space data using an unrolled iterative reconstruction algorithm 303 including a time compression network 301 configure to compress the input k-space data. The representation may be a medical image, A display displays the representation. Other components may be used, such as a remote server or a workstation performing the acquisition of the scan data, the reconstruction, and/or the display. The method is performed in the order shown or other orders. Additional, different, or fewer acts may be provided. For example, different preset, default, or user input settings are used to configure the scanning act 410. The output of the reconstruction process may be further processed or analyzed, for example by an addition neural network or model that is configured to further augment or process the image. As another example, the image is stored in a memory (e.g., computerized patient medical record) or transmitted over a computer network instead of or in addition to the display of act 440.

In act 410, the imaging device 36 scans a patient 11. The scan is guided by a protocol, such as parallel imaging with compressed sensing or another protocol. The pulse or scan sequence scans the region of the patient 11, resulting in scan data for a single imaging appointment. In an MR example, a pulse sequence is created based on the configuration of the MR scanner (e.g., the imaging protocol selected). The pulse sequence is transmitted from coils into the patient 11. The resulting responses are measured by receiving radio frequency signals at the same or different coils. The scanning results in k-space measurements as the scan data.

The scan uses a dynamic sequence including at least a time component, for example GRASP. The scan may use parallel imaging and/or compressed sensing. GRASP delivers high spatial and temporal resolution in volumetric MRI and is highly robust to the effects of patient motion. GRASP may be used in dynamic contrast-enhanced MRI of patients who may have trouble remaining still for long periods or performing lengthy breath holds in the scanner. In an embodiment, compressed sensing GRASP-VIBE is used. GRASP-VIBE enables dynamic contrast-enhanced exams with no breath holds. The acquisition is performed in one continuous run using a golden-angle stack-of-stars radial scheme that gives robustness towards motion and the flexibility to choose the temporal resolution, which can even vary over the duration of the scan. Alternative scan sequences may be used that are dynamic, non-Cartesian, or dynamic and non-Cartesian. For example, other sequence use-cases such as cardiac-cine or generally any dynamic MR sequences 2D+T or 3D+T.

In act 420, the control unit 20 compresses the non-Cartesian k-space data. In embodiment, the input of the time compression network 301 is the kspace data comprising a three-dimensional matrix of size: readout size×number of coils×number of time points, or as a two-dimensional matrix of size: number of coils×number of time points. The output of the time compression network 301 is a matrix of size: number of compressed time components×number of time points, wherein the number of compressed time components is predefined by a user. The number of compressed time components may be fixed. The compression matrix is used in the forward and backward imaging model of the data-consistency step of the unrolled network. The time compression network 301 may be any type of compression network that inputs a matrix of a certain size and outputs a compressed matrix. In an embodiment, the time compression network 301 comprises multiple fully connected layers with nonlinear activation functions of transformer encoder layers.

In an embodiment an orthogonalization procedure is applied at the end of the time-compression network. In order to impose the constraint of orthogonality or orthonormality to the compression matrix generated by our neural network, a Gram-Schmidt orthonormalization procedure or any other orthogonalization procedure such as Caley or Householder, at the end of the time-compression network. The resulting orthonormal matrix compression may then be used in the forward and backward imaging model.

In an embodiment, the time compression network 301 is first trained offline in a supervised way using ground truth images to generate the target compression matrices; wherein the time compression network 301 is then trained end to end with the unrolled reconstruction network. For example the time compression network 301 may be first trained offline in a supervised way using e.g. an incremental PCA applied on the ground truth images to generate the target compression matrices and then trained end to end with the unrolled reconstruction network.

In an embodiment, the number of compressed time components may be set between five and ten, wherein the number of time points is greater than one hundred. Different numbers of time components may be used depending on the type of sequence, time constraints, and computational constraints. The number of time components may be fixed.

In an embodiment, the time compression network 301 is trained with sequence of variable time points. In order to be able to use the network for a variable number of time points in the raw sequence, the network may be trained with sequence of variable time points. If the raw input has less time points than the network time dimension, the last remaining time points of the inputs are simply filled with zeros. The last time points that account for the difference between the number of time points of the network and the number of time points of the input measurements are then discarded at the input of the orthogonalization module of the time compression network 301.

The output of the time compression network 301 is an orthonormal matrix compression that is used in the reconstruction process as described below.

At act 430, a reconstruction process reconstructs an image from the compressed matrix. The reconstruction is performed using any of various techniques, for example, a unrolled iterative reconstruction algorithm 303. An optimization is performed to fit the scan data to an estimated representation, such as GRAPPA or other reconstruction algorithm. In other embodiments, the reconstruction uses, at least in part, a machine-learned model, such as a neural network trained with deep machine learning. The machine-learned model is previously trained, and then used as trained in reconstruction. Fixed values of learned parameters are used for application.

In one embodiment, the machine-learned model is trained to receive input of the compressed scan data and to output the reconstruction. In other embodiments, the machine-learned model is used in the reconstruction process, such as for applying a NuFFT or inverse NuFFT transform, determining a gradient, and/or regularization. Optimization is iteratively performed with the machine-learned model contributing to an act or acts (i.e., stages) in each or some of the iterations.

Any of various machine-learned models may be used, such as a neural network or support vector machine. In certain embodiments, the machine-learned model is part of an unrolled iterative reconstruction. For example, the machine-learned model implements a regularization function in the unrolled iterative reconstruction. An unrolled proximal gradient algorithm with Nesterov momentum includes a convolutional neural network (CNN) for regularization. To produce sharp reconstructions from input undersampled (compressed sensing) multi-coil (parallel imaging) k-space data, such network is first trained to minimize a combined L1 and a multi-scale version of the structural similarity (SSIM) content losses between network prediction and ground truth images for regularization. Other losses may be used, such as using just the L1 loss. The same or different machine-learned model or network (e.g., CNN) is used for each or some of the unrolled iterations. The CNN for regularization may be refined, such as using a semi-supervised refinement applied in a subsequent training step where an adversarial loss is based on Wasserstein Generative Adversarial Networks (WGAN). In another example, the unrolled iterative reconstruction is similar to the process disclosed in U.S. Patent Publication No. 20220180574A1 (patent application Ser. No. 17/303,790, filed Jan. 1, 2021) is used. The learnable parameters of the architecture of the reconstruction network are trained for altering the characteristic or characteristics, such as for denoising (removing or reducing noise). In the compressed sensing embodiment, the ground truth representation for training may be reconstructions formed from full sampling, so having reduced noise. Other ground truth representations may be used, such as generated by simulation or application of a denoising or other characteristic altering algorithm.

The training data includes many sets of data, such as representations output by reconstruction and the corresponding ground truth. Tens, hundreds, or thousands of samples are acquired, such as from scans of volunteers or patients, scans of phantoms, simulation of scanning, and/or by image processing to create further samples. Many examples that may result from different scan settings, patient anatomy, scanner characteristics, or other variance that results in different samples are used. In one embodiment, an already gathered or created MR dataset is used for the training data. The samples are used in machine learning (e.g., deep learning) to determine the values of the learnable variables (e.g., values for convolution kernels) that produce outputs with minimized cost or loss across the variance of the different samples.

A computer (e.g., processor 22) machine trains the reconstruction network. The time compression network 301 may be trained separately initially. Once trained, the time compression network 301 may be used in training the reconstruction network/process from end to end. The reconstruction network is machine trained using a supervised process and training data. In one embodiment, deep learning is used. The training learns both the features of the input data and the conversion of those features to the desired output. Backpropagation, RMSprop, ADAM, or another optimization is used in learning the values of the learnable parameters of the network (e.g., the convolutional neural network (CNN) or fully connection network (FCN)). Where the training is supervised, the differences (e.g., L1, L2, mean square error, or other loss) between the estimated output and the ground truth output are minimized.

Any architecture or layer structure for machine learning to perform an operation for separately reconstructing from subsets may be used. For example, any of the architectures may be used. The architecture defines the structure, learnable parameters, and relationships between parameters. In one embodiment, a convolutional or another neural network is used. Any number of layers and nodes within layers may be used. A DenseNet, U-Net, encoder-decoder, Deep Iterative Down-Up CNN, image-to-image and/or another network may be used. Some of the network may include dense blocks (i.e., multiple layers in sequence outputting to the next layer as well as the final layer in the dense block). Any known or later developed neural network may be used. Any number of hidden layers may be provided between the input layer and output layer.

Machine learning is an offline training phase where the goal is to identify an optimal set of values of learnable parameters of the model that can be applied to many different inputs. These machine-learned parameters can subsequently be used during clinical operation. Once learned, the machine-learned model is used in an online processing phase in which a reconstruction for a given patient 11 is provided using a determined scaling factor that, for example, adjusts the step size of the gradient update and allows for tuning of the denoising level of the reconstruction. In an embodiment, a scaling factor may further be implemented during the training of the reconstruction networks. For certain networks, the data consistency term may be represented by: $D=1/\sigma^2|Ax-y|^2$, where $\sigma$ is the standard deviation of the thermal noise. This is an accurate assumption for the noise characteristics of MR data and is measured on modern MR scanners in adjustments steps (and therefore available for considered datasets). This allows for a Bayesian motivation of unrolled networks and to consider the gradient step as the gradient of the logarithmic Bayesian probability of the image for given data. Therefore, the step size may vary with $1/\sigma^2$, which can be considered in the training.

The reconstruction may output the representation as pixels, voxels, and/or a display formatted image in response to the input. In an embodiment, the output of the reconstruction process may be multichannel image data, for example represented as a compressed time×h×w. In an embodiment, a decompression matrix is applied at the end of the reconstruction process. The decompression matrix may be the transpose conjugate of the compression matrix. The decompression matrix may be used at the end of the unrolled network in order to decompress the multichannel image in the individual time points.

The learned values and network architecture, with any algorithms (e.g., extrapolation and gradient update) determine the output from the input. The output of the reconstruction, such the output of the machine-learned model, is a two-dimensional distribution of pixels representing an area of the patient 11 and/or a three-dimensional distribution of voxels representing a volume of the patient 11. The output from the last reconstruction iteration may be used as the output representation of the patient 11.

Other processing may be performed on the input k-space measurements before input. Other processing may be performed on the output representation or reconstruction, such as spatial filtering, color mapping, and/or display formatting. In one embodiment, the machine-learned network outputs voxels or scalar values for a volume spatial distribution as the medical image. Volume rendering is performed to generate a display image. In alternative embodiments, the machine-learned network outputs the display image directly in response to the input.

In act 440 of FIG. 4, the processor 22 generates and displays an image of the object from the output representation. The resulting representation or image may be rendered to a two-dimensional display. A display (e.g., display screen or device) displays the medical image, such as the MR image, a series of images (over time), and/or a 3D volume generated from multiple images or slices. The medical image, after or as part of any post processing, is formatted for display on the display. The display presents the image for viewing by the user, radiologist, physician, clinician, and/or patient 11. The image assists in diagnosis, prognosis, and/or therapy. The displayed image may represent a planar region or area in the patient 11. Alternatively, or additionally, the displayed image is a volume or surface rendering from voxels (three-dimensional distribution) to the two-dimensional display.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description. Independent of the grammatical term usage, individuals with male, female or other gender identities are included within the term.

The invention claimed is:

1. A method of reconstruction for a medical imaging system, the method comprising:

scanning a patient by the medical imaging system, the scanning acquiring k-space scan data using a dynamic MR sequence that includes at least a time component;

applying, by a time compression network trained jointly with an unrolled iterative reconstruction network, a learned temporal compression to the k-space scan data to generate a time compression matrix that represents temporal correlations of the dynamic MR sequence;

reconstructing an image using the unrolled iterative reconstruction network that includes at least a data-consistency step, wherein the time compression matrix is used within the data-consistency step; and outputting the image.

2. The method of claim 1, wherein the dynamic MR sequence comprises a GRASP (Golden-angle RAdial Sparse Parallel imaging) sequence.

3. The method of claim 1, further comprising:

applying an orthogonalization procedure at an end of the time compression network.

4. The method of claim 3, wherein the orthogonalization procedure comprises a Gram-Schmidt orthonormalization procedure, a Cayley transformation, or a Householder transformation.

5. The method of claim 1, further comprising:

applying a decompression matrix at an end of the unrolled iterative reconstruction network.

6. The method of claim 1, wherein the time compression network is first trained offline using supervised learning and ground truth images to generate target compression matrices; wherein the unrolled iterative reconstruction network is then trained end to end with the trained time compression network.

7. The method of claim 1, wherein an input of the time compression network is the k-space scan data comprising a three-dimensional matrix of size: readout size×number of coils×number of time points, or as a two-dimensional matrix of size: number of coils×number of time points.

8. The method of claim 1, wherein an output of the time compression network is a matrix of size: number of compressed time components×number of time points, wherein the number of compressed time components is predefined by an operator.

9. The method of claim 8, wherein the number of compressed time components is between five and ten and wherein the number of time points is greater than one hundred.

10. The method of claim 1, wherein the time compression network comprises multiple fully connected layers with nonlinear activation functions of transformer encoder layers.

11. The method of claim 1, wherein the time compression network is trained with sequence of variable time points.

12. A system for time compressed dynamic magnetic resonance deep learning reconstruction, the system comprising:

a medical imaging system configured to acquire k-space scan data using a non-Cartesian dynamic sequence;

a time compression network configured to compress the k-space scan data; and an unrolled iterative reconstruction network trained jointly with the unrolled iterative reconstruction network, the unrolled iterative reconstruction network configured to reconstruct an image, wherein the unrolled iterative reconstruction network is configured to apply, using the time compression network, a learned temporal compression to the k-space scan data to generate a time compression matrix that represents temporal correlations of the non-Cartesian dynamic sequence, wherein the unrolled iterative reconstruction network includes at least a data-consistency step, wherein the time compression matrix is used within the data-consistency step.

13. The system of claim 12, further comprising:

a display configured to display the image.

14. The system of claim 12, wherein the non-Cartesian dynamic sequence comprises a GRASP (Golden-angle RAdial Sparse Parallel imaging) sequence.

15. The system of claim 12, wherein the time compression network is first trained offline using supervised learning and ground truth images to generate target compression matrices; wherein the unrolled iterative reconstruction network is then trained end to end with the trained time compression network.

16. The system of claim 12, wherein an input of the time compression network is the k-space scan data comprising a three-dimensional matrix of size: readout size×number of coils×number of time points, or as a two-dimensional matrix of size: number of coils×number of time points and wherein an output of the time compression network is a matrix of size: number of compressed time components×number of time points, wherein the number of compressed time components is predefined by an operator.

17. The system of claim 16, wherein the number of compressed time components is between five and ten and wherein the number of time points is greater than one hundred.

18. A non-transitory computer readable storage medium comprising a set of computer-readable instructions stored thereon which, when executed by at least one processor cause the processor to:

acquire non-Cartesian k-space scan data that includes at least a time component;

apply, by a time compression network trained jointly with an unrolled iterative reconstruction network, a learned temporal compression to the non-Cartesian k-space scan data to generate a time compression matrix that represents temporal correlations of the non-Cartesian k-space scan data;

reconstruct an image using an unrolled iterative recon-
struction that includes at least a data-consistency step,
wherein the time compression matrix is used within the
data-consistency step; and output the image.

19. The non-transitory computer readable storage medium of claim 18, wherein the non-Cartesian k-space scan data is acquired using a GRASP (Golden-angle RAdial Sparse Parallel imaging) sequence.

20. The non-transitory computer readable storage medium of claim 18, wherein an input of the time compression network is the non-Cartesian k-space scan data comprising a two-dimensional matrix of size: number of coils×number of time points and wherein the time compression matrix is a matrix of size: number of compressed time components× number of time points, wherein the number of compressed time components is predefined by an operator.

\* \* \* \* \*